(12) United States Patent
Kim

(10) Patent No.: US 9,735,188 B2
(45) Date of Patent: Aug. 15, 2017

(54) IMAGE SENSOR WITH SOLAR CELL FUNCTION

(71) Applicant: Hoon Kim, Singapore (SG)

(72) Inventor: Hoon Kim, Singapore (SG)

( * ) Notice: Subject to any disclaimer, the term of this patent is extended or adjusted under 35 U.S.C. 154(b) by 0 days.

(21) Appl. No.: 14/883,587

(22) Filed: Oct. 14, 2015

(65) Prior Publication Data

US 2016/0211291 A1 Jul. 21, 2016

Related U.S. Application Data

(60) Provisional application No. 62/104,068, filed on Jan. 15, 2015.

(51) Int. Cl.
| | |
|---|---|
| *H01L 31/062* | (2012.01) |
| *H01L 31/113* | (2006.01) |
| *H01L 27/142* | (2014.01) |
| *H01L 27/146* | (2006.01) |
| *H01L 31/053* | (2014.01) |

(52) U.S. Cl.
CPC ........ *H01L 27/142* (2013.01); *H01L 27/1461* (2013.01); *H01L 27/14612* (2013.01); *H01L 27/14643* (2013.01); *H01L 31/053* (2014.12)

(58) Field of Classification Search
CPC .............. H01L 27/142; H01L 27/1461; H01L 27/14643; H01L 31/053; H01L 27/14612
See application file for complete search history.

(56) References Cited

U.S. PATENT DOCUMENTS

| | | | | |
|---|---|---|---|---|
| 4,173,765 | A | | 11/1979 | Heald et al. |
| 4,623,909 | A | * | 11/1986 | Nishizawa .......... H01L 31/1126 257/113 |
| 4,906,856 | A | * | 3/1990 | Iwanami ........... H01L 27/14681 257/291 |
| 5,017,991 | A | * | 5/1991 | Nishizawa .......... H01L 29/1016 257/114 |
| 5,274,459 | A | * | 12/1993 | Hamasaki ............ H04N 5/3452 348/249 |
| 5,880,494 | A | * | 3/1999 | Watanabe ............. H01L 31/113 257/225 |

(Continued)

FOREIGN PATENT DOCUMENTS

| | | |
|---|---|---|
| EP | 067566 A2 | 12/1982 |
| JP | H11312798 A | 11/1999 |

(Continued)

OTHER PUBLICATIONS

European Search Report for 12827107.9, mailed Jun. 17, 2015.

(Continued)

*Primary Examiner* — Victor A Mandala

(57) ABSTRACT

A unit pixel element that acts as an image sensor or a solar cell according to the present invention comprises a photo detector that drives a photocurrent flow, induced by light incident onto the gate, along the channel between the source and the drain; a first switch that is wired and switched on or switched off between the source terminal of the photo detector and the first solar cell bus; and a second switch that is wired and switched on or switched off between the gate terminal of the photo detector and the second solar cell bus, and features a function of light energy harvesting and high-efficiency photoelectric conversion that generates and supplies effective electric power.

7 Claims, 6 Drawing Sheets

(56) References Cited

U.S. PATENT DOCUMENTS

| | | |
|---|---|---|
| 5,886,368 A | 3/1999 | Forbes et al. |
| 6,150,693 A | 11/2000 | Wollesen |
| 6,303,919 B1 | 10/2001 | Yokomichi et al. |
| 7,196,312 B2 | 3/2007 | Shizukuishi |
| 7,271,430 B2 | 9/2007 | Park et al. |
| 8,569,806 B2 | 10/2013 | Kim |
| 8,610,234 B2 | 12/2013 | Kim |
| 8,653,618 B2 | 2/2014 | Kim |
| 8,669,598 B2 | 3/2014 | Kim |
| 8,669,599 B2 | 3/2014 | Kim |
| 2004/0217262 A1 | 11/2004 | Lee |
| 2005/0082582 A1* | 4/2005 | Rhodes ............ H01L 27/14689 257/291 |
| 2005/0151061 A1 | 7/2005 | Ogura et al. |
| 2008/0211047 A1 | 9/2008 | Iida |
| 2008/0237664 A1 | 10/2008 | Joo et al. |
| 2009/0032852 A1 | 2/2009 | Song et al. |
| 2009/0101915 A1 | 4/2009 | Weng et al. |
| 2009/0256176 A1 | 10/2009 | Kobayashi et al. |
| 2009/0302358 A1 | 12/2009 | Mao et al. |
| 2010/0073538 A1 | 3/2010 | Cieslinski |
| 2010/0270459 A1* | 10/2010 | Augusto ........... H01L 27/14609 250/208.1 |
| 2011/0042551 A1 | 2/2011 | Ha |
| 2013/0049084 A1* | 2/2013 | Saka .................... H01L 27/1463 257/294 |

FOREIGN PATENT DOCUMENTS

| | | |
|---|---|---|
| JP | 2001230443 A | 8/2001 |
| JP | 2011243704 A | 12/2011 |
| KR | 20050054059 | 6/2005 |
| KR | 100558527 B1 | 3/2006 |
| KR | 20090043737 | 5/2009 |
| WO | 3812741 A | 3/1998 |

OTHER PUBLICATIONS

European Search Report for 12828199.5, mailed Jun. 2, 2015.
Notice of Allowance for U.S. Appl. No. 14/883,589, dated Apr. 11, 2017.

\* cited by examiner

IMAGE SENSOR WITH SOLAR CELL FUNCTION

CROSS-REFERENCE TO RELATED APPLICATIONS

This application claims the benefit of U.S. Provisional Application No. 62/104,068, filed Jan. 15, 2015.

TECHNICAL FIELD

The present invention relates to an image sensor that also acts as a solar cell and an electronic device using the image sensor with a solar cell function and, more specifically, to a technology that acts, in general, as an image sensor and operates, as necessary, by being converted to a specific mode, as a solar cell.

BACKGROUND ART

Light energy harvesting, which wirelessly charges an existing battery by converting light energy to electric power, is a technology inevitably required to establish the Internet of things (IoT), ubiquitous sensor networks (USN), wireless sensor networks (WSN) and the like and acts as a semi-permanent power source supplied to diverse electronic devices related to such fields.

Accordingly, the light energy harvesting technology is required to be microminiaturized and integrated. Although some studies have shown attempts to manufacture a light energy conversion device that is similar to an integrated solar cell (ISC) by employing P-N junction photodiode technique from the CMOS process in order to integrate the light energy conversion device into another circuit, such a photodiode exhibits a low photoelectric conversion efficiency, which is not adequate to supply the circuits in the chip with sufficient power. Furthermore, it is a long way to go to fully integrate a solar cell process with a standard CMOS process.

The present invention relates to a method and technical thoughts pertinent to it to provide a pixelated solar cell system on chip (SOC) on the basis of and improving the registered patents, "Unit Pixel of Image Sensor and Photo Detector Thereof"(U.S. Pat. No. 8,569,806B2, U.S. Pat. No. 8,610,234B2 and U.S. Pat. No. 8,669,599B2). To this purpose, the structure and operation of a photo detector and a pixelated solar cell manufactured via a standard CMOS process will be described and a method will be proposed where a pixel of a solar cell thus manufactured shares a single cell with a pixel of an image sensor so that each function may be selected as necessary.

Technical Problem

Accordingly, in order to solve those problems aforementioned, the present invention provides a method to make a pixel of a solar cell equipped with a high-efficiency photo detector share a single cell with a pixel of an image sensor and to select, as necessary, either of the both functions to use as an image sensor or as a solar cell to produce and store driving power.

Technical Solution

A unit pixel element that may act as an image sensor or a solar cell according to an embodiment of the present invention comprises a photo detector that drives a photo-current flow, induced by light incident onto the gate, along the channel between the source and the drain; a first switch that is wired and switched on or switched off between the source terminal of the photo detector and the first solar cell bus; and a second switch that is wired and switched on or switched off between the gate electrode of the photo detector and the second solar cell bus.

A unit pixel element that may act as an image sensor or a solar cell according to an embodiment of the present invention comprises a photo detector that drives a photo-current flow, induced by light incident onto the gate, along the channel between the source and the drain; a first switch that is switched on or switched off between the gate terminal of the photo detector and the first solar cell bus; and a selection device that is wired between the source terminal of the photo detector and the second solar cell bus in order to output the photocurrent off the pixel output terminal.

A unit pixel element that may act as an image sensor or a solar cell according to another embodiment of the present invention comprises a photo detector that drives a photo-current flow, induced by light incident onto the gate, along the channel between the source and the drain; a first switch that is switched on or switched off between the gate terminal of the photo detector and the first solar cell bus; a second switch that switched on or switched off between the reset terminal of the photo detector and the first solar cell bus; and a selection device that is wired between the source terminal of the photo detector and the second solar cell bus in order to output the photocurrent off the pixel output terminal.

Advantageous Effects

A technology according to an embodiment of the present invention may provides a technology that may act as an image sensor equipped with a function of light energy harvesting and effectively produce and supply power.

In addition, a technology according to a preferred embodiment of the present invention may be manufactured being fully integrated with ease to adjacent circuits including an image sensor and all the circuits as well manufactured in a CMOS process.

MODE FOR INVENTION

Since the present invention may have a plurality of variations and embodiments, a few specific embodiments will now be exemplified in details with reference to drawings and descriptions. The structural and functional statements provided for an embodiment, however, are nothing more than an exemplification of the purpose of the embodiment, and must not be interpreted to restrict the present invention within a specific mode for carrying out the invention but must be interpreted to include all the modifications, equivalents and substitutes that are incorporated in the scope of the thoughts and technology of the present invention. Any detailed description on related, well-known technology will be omitted should the detailed description be judged to obscure the intent of the present invention. Those numerals, such as the first, the second, etc., referred to in this specification are nothing more than an identifier to distinguish a certain element from another.

Should an element of the present invention be described to be "wired", "connected", "linked", etc., to other element(s), it must be interpreted that the element may be explicitly and directly wired, connected, linked, etc. to another element(s) or, except otherwise contrarily provided, it must be also interpreted that the element may be wired, connected, linked, etc. to other element(s) with other component(s) in between.

Preferred embodiments of the present invention will now be described more specifically with reference to the accompanying drawings.

Figure 1:
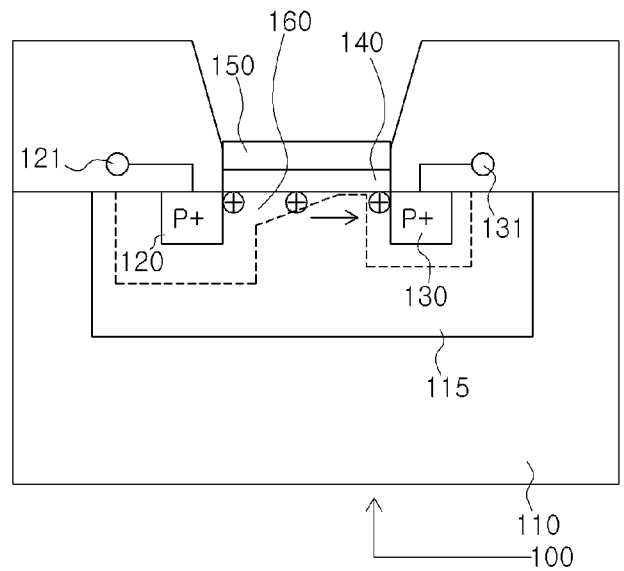
FIG. 1 is a cross-sectional view of a photo detector that shows high-efficiency photoelectric conversion according to the present invention.

FIG. 1 is a cross-sectional view of a photo detector that shows high-efficiency photoelectric conversion according to the present invention.

A light-receiving device, which corresponds to the photo detector, of a unit pixel is established by means of a tunnel junction device instead of an existing photodiode as illustrated in FIG. 1, where a tunnel junction device, in which a thin insulating layer is sandwiched between two conductors or semiconductors, is defined as an electronic element that operates using a tunneling effect generated in the insulating layer. For information purpose, a tunneling effect, as a term based on quantum mechanics, is a phenomenon that a particle that moves where force having potential exerts its effect penetrates an area the potential energy of which is larger than the kinetic energy the particle has.

An embodiment of the present invention provides a method to produce a light-receiving device and a solar cell as a unit pixel by means of such a photo detector, where the term "photo detector" used in the specifications and claims refers to a light-receiving device and a solar cell materialized by means of the tunnel junction device. The photo detector may be established into various configurations including, for example, a common n-MOSFET or p-MOSFET. In addition, the unit device may also be established using a HET, a HEMT, etc. that derives a tunneling effect.

As illustrated in FIG. 1, the photo detector 100 has a PMOS structure. The photo detector 100 is built up on a p-substrate 110, designated also as P-sub in FIG. 1, and comprising a P+ diffusion layer 120 and another P+ diffusion layer 130 that corresponds to the source and drain, respectively, of a common NMOS. Each P+ diffusion layer 120, 130 will be referred to as the "source" and "drain", respectively, of a photo detector according to the present invention.

On top of the source 120 and drain 130 are built up a source electrode 121 and drain electrode 131 that is wired to an external node, respectively.

An N-well 115 is structured upon n-type impurities being doped onto the P-sub 110 for the photo detector 110. On the N-well thus formed are constructed the source 120 and the drain 130, doped by P-type impurities. Then, a thin oxide layer 140 is formed between the source 120 and the drain and a polysilicon area, doped by n-type impurities, is formed that corresponds to the gate of a common MOSFET on the top of the oxide layer 140. The polysilicon 150 area acts as a light-receiving component in the photo detector, therefore the polysilicon 150 is to be referred to as "light-receiving section" hereinafter.

The light-receiving section 150 stands off, over the oxide layer 140, the source 120 and the drain 130. A tunneling arises en route from the light-receiving section 150 to the source 120 or the drain 130, where a thickness of 10 nm or less of the oxide layer 140 is preferred to facilitate the tunneling effect.

In the photo detector 100, a metallic, light-shielding layer may be overlaid on the area except for the top of the light-receiving section 150 as is not the case with a common MOSFET. The photo detector 100 exploits the light-shielding layer to restrict incident light only onto the light-receiving section and, in turn, to maximize photoelectric conversion efficiency.

The photo detector 100 may be fabricated via a standard CMOS process that is identical to the process employed to fabricate other circuits and used as part of an integrated system, which accounts for seamless integration and various applications.

Figure 2:
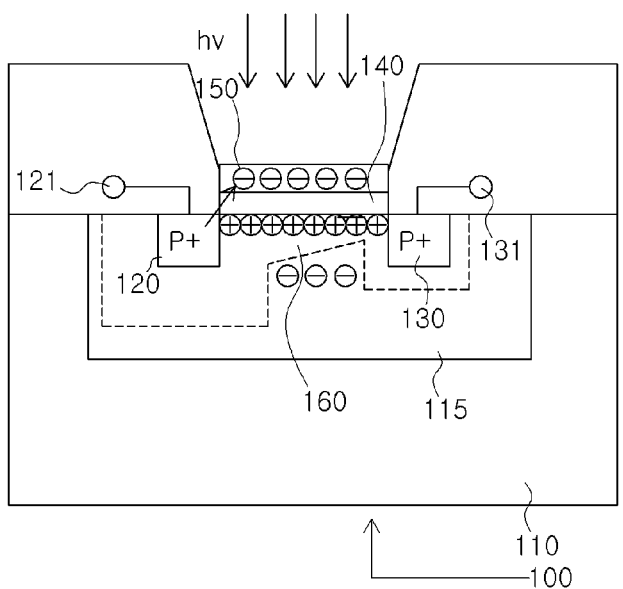
FIG. 2 is a cross-sectional view for describing a high-efficiency photoelectric conversion mechanism of the photo detector according to the present invention.

FIG. 2 is a cross-sectional view for describing a photoelectric conversion mechanism of a photo detector 100 according to the present invention. The photo detector 100 admits, via the top side of a light-receiving section, light that then generates electron-hole pairs (EHPs) deriving a certain electric field between the light-receiving section 150 and the source 120 or drain 130. Should the voltage reach a certain value between the source electrode 120 and the drain electrode 131, the charges excited by light tunnel, from the light-receiving section, through the oxide layer 140 into the source 120 or the drain 130. Upon the charges tunneling, holes are depleted in and electrons flow into the light-receiving section 150 so that the charge quantity of electrons overwhelms that of holes. The change in charge quantity lowers the threshold voltage of the channel 160 between the source 120 and the drain 130, which leads photocurrent to flow along the channel 160. The technology described so far is also expounded in detail both in the US patents U.S. Pat. No. 8,569,806B2, U.S. Pat. No. 8,610,234B2 and U.S. Pat. No. 8,669,599B2 that were registered and U.S. patent application Ser. No. 14/327,549 that are now pending, all of which were applied by the inventor of the present invention, therefore it may not be required to be described detailedly further.

Incident light comes only onto the top of the light-receiving section 150 of a photo detector 100 according to the present invention, where the light-receiving section opens outward to admit light of a diverse wavelengths that, in turn, is absorbed in the light-receiving section 150 or, depending on the wavelength, penetrates the light-receiving section 150 to reach the N-well 115 underneath or the substrate 110 further underneath. For example, should the light-receiving section 150 have a thickness of 150 nm or more, blue, or shortwave, light cannot reach the substrate 100 but is mostly absorbed in the light-receiving section 150.

Unlike an existing, common photo detector, a photo detector 100 the present invention provides, even if any shortwave light is to be absorbed in the light-receiving section 150, failing in reaching the substrate underneath, changes in the charge quantity in the light-receiving section 150 by means of the energy the light-receiving section 150 absorbs and, in turn, drives current along the channel, which facilitates detection of light of short wavelengths while all the rest light of other wavelengths penetrates the light-receiving section 150 deriving a similar phenomenon in the light-receiving section 150, which also changes in the threshold voltage of the current channel.

Meanwhile, light with relatively longer wavelengths enough to penetrate the light-receiving section 150 generates EHPs also in the N-well 115 so that electrons pile up, as illustrated in FIG. 2, in the N-well 115 underneath the channel to have an influence on the change of the threshold voltage. A photo detector 100 fabricated according to such a method shows not only a very high sensitivity to detect even a single photon but also performance to drive a very large current flow by means of a slight amount of light. Accordingly, a photo detector 100 of the present invention may act as an image sensor and a solar cell as well.

A solar sensor chip as a system on chip (SOC) will be proposed below on the basis of such a photo detector to which a function of a solar cell has been newly added. While a PMOS-type configuration is described in FIGS. 1 and 2, an NMOS-type configuration and other similar configurations as well may also be established, all of which must be interpreted to be included in the rights of the present invention.

Figure 3:
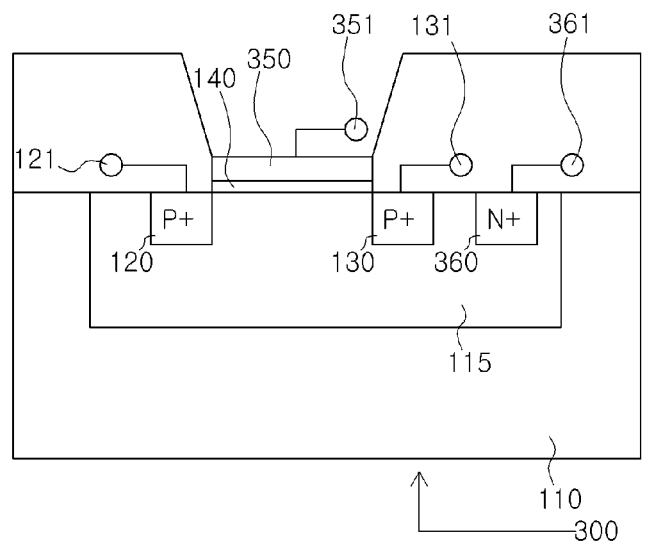
FIG. 3 is a cross-sectional view of a photo detector for a solar cell according to the present invention.
Figure 4:
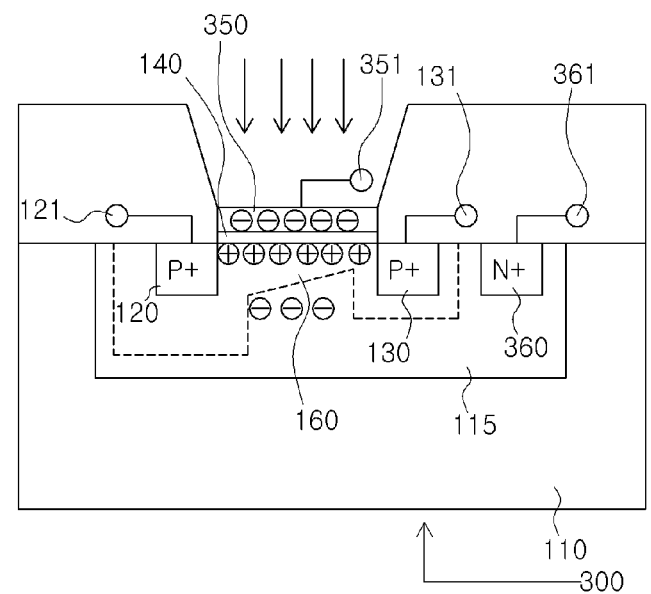
FIG. 4 is a cross-sectional view for describing an electric power generation mechanism of the photo detector according to the present invention.

FIG. 3 and FIG. 4 is a cross-sectional view of a photo detector for a solar cell according to the present invention and a cross-sectional view for describing an electric power generation mechanism of the photo detector 300, respectively. When operating as a solar cell, the photo detector 300 induces photocurrent according to light absorption and generates photovoltaic electromotive force.

In the photo detector 300, as illustrated in FIG. 3, upon light being absorbed in a light-receiving section 350, electrons tunnel through the oxide layer 140 from the channel between the source 120 and the drain 130 to move to the light-receiving section 350, which changes the entire charge quantity of the light-receiving section 350. The change in the current quantity induced by light may be estimated by measuring the voltage applied between the light-receiving section 350 and the drain 130. In addition, the charges accumulated in the N-well 115 may be estimated also by measuring the voltage between the drain 130 and the electrodes 131, 361 of the W-RST 360.

In the photo detector 300, as illustrated in FIG. 4, if light the energy of which is larger than the threshold voltage, determined in the fabrication process, of the transistor, photocurrent is to flow along the channel 160.

More specifically, the silicon interface was initially designed to have a threshold voltage, between the source 120 and the drain 130 where a channel 160 may be built up, right below the sub-threshold voltage, wherein, without incident light onto the light-receiving section 350, no photocurrent flows along the channel 160.

When light the energy of which is larger than the energy that binds an impurity doped in the light-receiving section 350 with a charge, a plurality of electrons and holes in the light-receiving section freely move on either side with the oxide layer 140, which prohibits in an equilibrium state each type of charges from getting across into the opposite side, as the barrier. Each EHP thus generated exists as an electron and a hole per se for a certain period of time before the electron and the hole are recombined, and migrates to the area to which the electric field is concentrated.

Because the potential of the silicon interface is right below the sub-threshold between the source and the drain 130, electrons or holes tunnel from the light-receiving section 350 to the source 120 or the drain 130 due to the charge quantity that has been increased and the electric field that has been dense driven by the incident light onto the light-receiving section 350, which lowers the threshold voltage of the channel 160 and, in turn, photocurrent flows proportionally to the amount of the light of the channel 160.

The voltage that drives the photocurrent may be detected via the light-receiving section 350 or the N-well 115. The value of the voltage thus measured may range from a few nanoamperes- to a few microamperes depending on the amount of light detected via the N-well 115, which brings about a voltage difference ranging from 0.1 to 1.0 V. The value is measured excluding any effect of dark current while such an output is acquired from a pixel of 3 µm or less. Therefore, a considerably larger output may be acquired by arranging a plurality of pixels in series or in parallel to constitute and control a pixel array.

Figure 5:
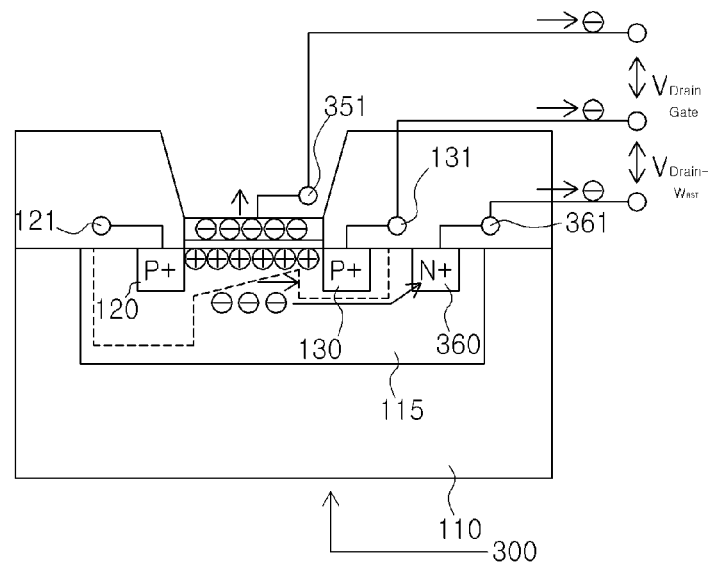
FIG. 5 is a cross-sectional view of a Voc acquisition mechanism of the photo detector according to the first embodiment of the present invention.

FIG. 5 is a cross-sectional view of a Voc acquisition mechanism of the photo detector 300 according to the first embodiment of the present invention.

As illustrated in FIG. 5, should a certain amount of voltage be applied between the source 120 and the drain 130, incident light into the light-receiving section 350 changes the threshold voltage, which drives photocurrent to flow. Light of longer wavelengths penetrates the light-receiving section 350 then is absorbed in the N-well 115, which generates a certain amount of charges also in the N-well 115 that then piles up around the interface of the channel according to a principle identical to that underlies the charge generation in the light-receiving section 150.

The photocurrent that flows along the channel is driven by the voltage that is generated by the charge quantity in the light-receiving section 350 and the N-well 115. More specifically, the photocurrent thus driven generates $V_{Drain-Gate}$ or the voltage between the drain 130 and the light-receiving section 350 and $V_{Drain-Wrst}$ or the voltage between the drain 350 and the N-well 115. Therefore, Voc is acquired by measuring any one of the values of the $V_{Drain-Gate}$ applied between a terminal 131 wired to the drain 130 and a terminal 351 wired to the light receiving section 350, and the $V_{Drain-Wrst}$ applied between a terminal 131 wired to the drain 350 and a terminal 361 wired to the N-well 115.

Figure 6:
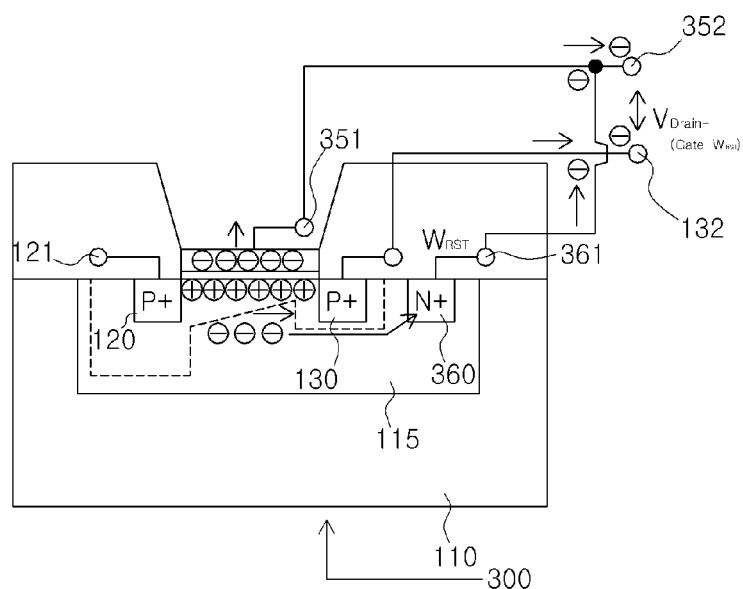
FIG. 6 is a cross-sectional view of a Voc acquisition mechanism of the photo detector according to the second embodiment of the present invention.

FIG. 6 is a cross-sectional view of a Voc acquisition mechanism of the photo detector 300 according to the second embodiment of the present invention.

Not only a larger amount of photocurrent from the photo detector 300 but also a larger amount of Voc is required to acquire also a larger output. In this regard, as illustrated in FIG. 6, a larger amount of voltage, $V_{Drain-(gate-wrst)}$, may be applied between a terminal that connects the light-receiving section 350 to the N-well 115 and a terminal 132 wired to the drain 130 if the threshold of the channel increases by connecting a terminal 351 wired to the light-receiving section 350 to a terminal 361 wired to an N+ diffusion layer 360, which is due to the charge quantity additionally increased when the electrons underneath of the N-well 115 moves to the N+ diffusion layer 360.

Figure 7:
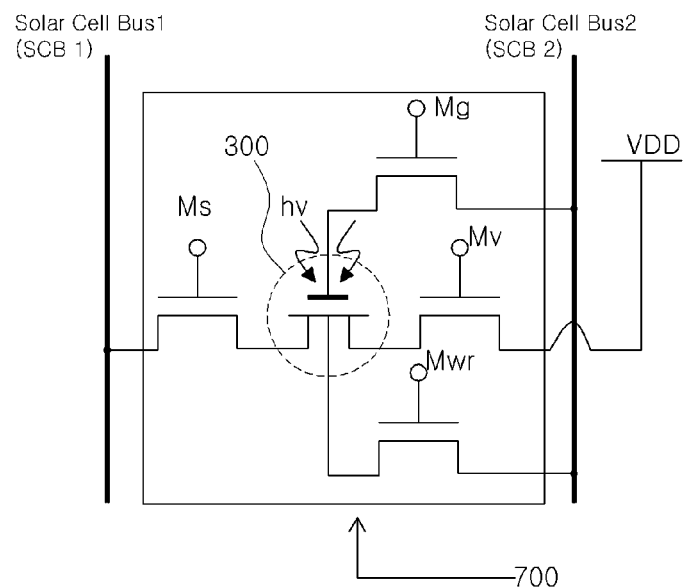
FIG. 7 illustrates a configuration of a unit pixel of a solar cell according to the present invention.

FIG. 7 illustrates a configuration of a unit pixel of a solar cell according to the present invention, where the solar cell, as a pixelated solar cell, comprises a unit pixel 700. The unit pixel 700 comprises the photo detector 300, a first switch, Ms; a second switch, Mg; a third switch Mwr; a fourth switch Mv; a first solar cell bus, SCB1; and a second solar cell bus, SCB 2. The photo detector 300 generates photocurrent along the channel between the source and the drain driven by the light, hv, incident onto the light-receiving section or the gate. The first switch, Ms, being wired between the source terminal of the photo detector 300 and the first solar cell bus, SCB 1, is made or broken for an on or off state. The second switch, Mg, being wired between the light-receiving section, or the gate, terminal of the photo detector 300 and the second solar cell bus, SCB 2, is made or broken for an on or off state. The third switch, Mwr, being wired between a reset terminal connected to the N-well or the substrate of the photo detector 300 and the second solar cell bus for an on or off state. The reset terminal is doped with impurities that are different from those doped in the source and the drain. With reference to FIGS. 3 through 6, the reset terminal, Wrst, is doped with n-type impurities other than those p-type impurities injected in the source and the drain while the reset terminal in an NMOS may be doped with p-type impurities other than those n-type impurities injected in the source and the drain, where VDD is linked to an extra, external system power source and left fixed in order to drive the photo detector 300. For this purpose, the VDD may be connected to the drain of the photo detector via the fourth switch, Mv, where a minimum value of VDD may be applied in order to make the dark current minimized while an extra circuit may be added outside the pixel to get rid of the dark current.

Meanwhile, the photo detector 300 may use a power source identical to what adjacent circuits use since the photo detector 300 is fabricated in a process identical to the process via which the adjacent circuits are fabricated. In such a case, unlike an existing photo detector, the photo detector 300 according to the present invention may be configured to use the power source per se the adjacent circuits use without any additional, extra power source. With incident light onto the photo detector 300, photocurrent is to flow en route from the first solar cell bus, SCB 1, to the second solar cell bus, SCB 2, while Voc is to be obtained between the first solar cell bus, SCB 1, and the second solar cell bus, SCB 2, by controlling the second switch, Mg, and the third switch, Mwr.

The second switch, Mg, and the third switch, Mwr, may be selectively connected to an external matrix such as row decoders by on/off activities, where the second switch, Mg, and the third switch, Mwr, may be switched on to the second solar cell bus, SCB 2, either in a staggered mode or simultaneously. Should both the second switch, Mg, and the third switch, Mwr, be simultaneously made to be connected to an external matrix, a larger value of Voc may be obtained than in the case the light-receiving section and the N-well of the photo detector 300 is separately connected to the second solar cell bus, SCB 2, as illustrated in FIG. 6.

Figure 8:
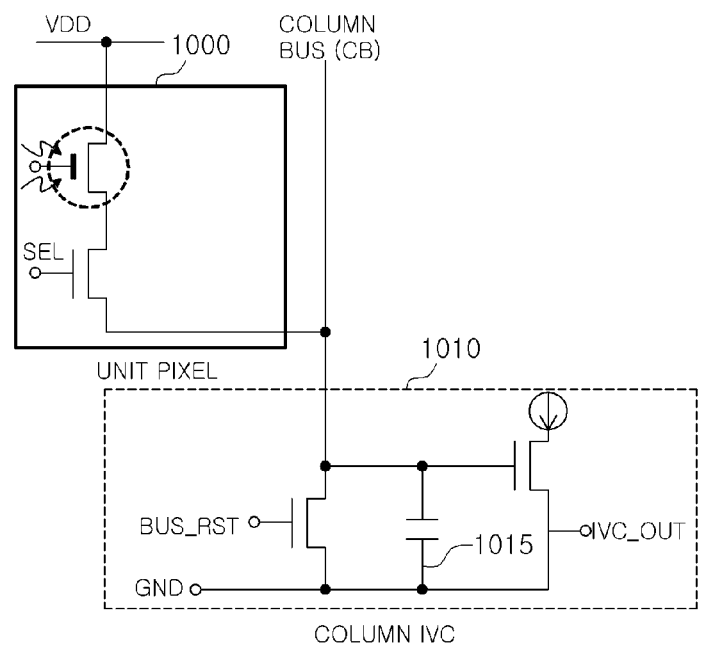
FIG. 8 is a schematic configuration of a unit pixel of an image sensor according to the first embodiment of the present invention.

FIG. 8 is a schematic configuration of a unit pixel of an image sensor according to the first embodiment of the present invention. The unit pixel 1000 is equipped a selection device, SEL, that is wired to the photo detector 300 while the unit pixel 1000 may be connected, via a column bus, CB, to an imange sencor comprising an IVC circuit 1010 that is a DC voltage converting circuit, where the SEL may be established in a form, for example an MOSFET structure, among various devices. In such a case, both the photo detector 300 and the SEL are simultaneously fabricated in an MOSFET process, which facilitates fabrication convenience with lower costs.

Figure 9:
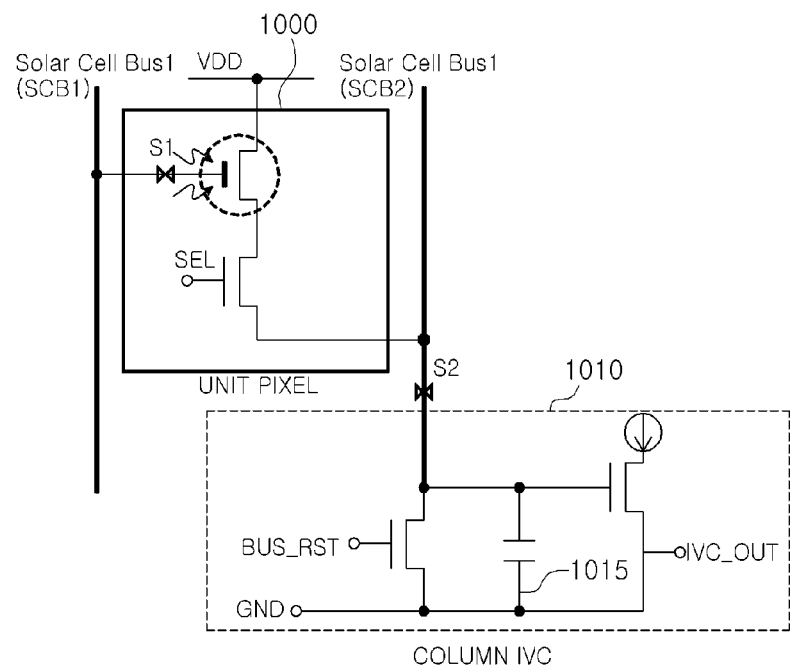
FIG. 9 is a schematic configuration of a unit pixel of a solar cell according to the first embodiment of the present invention.

Should the SEL be switched on, the photocurrent photo-electrically converted in the photo detector 300 of the unit pixel 1000 commences being accumulated in a capacitor 1015 in the IVC circuit 1010. The photocurrent stored in the capacitor 1015 is to be output as voltage the amount of which is IVC_OUT and the signal of which is transmitted to circuits including CDS (co-double sampling). When the selection device, SEL, is switched on, should the BUS_RST be switched on, the column bus, CB, and the photo detector 300 as well as the capacitor 1015 in the IVC circuit 1010 are directly connected to the ground section, GND, which discharges the charges accumulated and resets the signals. An integration time required for an image sensor may be defined via those activities aforementioned. FIG. 9 is a schematic configuration of a unit pixel of a solar cell according to the first embodiment of the present invention. The unit pixel 1100 is a solar sell into which the unit pixel 1000 of the 1T-type image sensor shown in FIG. 8 has been materialized. For this purpose, the unit pixel 1100 as a solar cell may be established utilizing the image sensor shown in FIG. 8 by adding a first solar cell bus, SCB 1, and a second solar cell bus 2, SCB 2, and switches S1 and S2.

Figure 10:
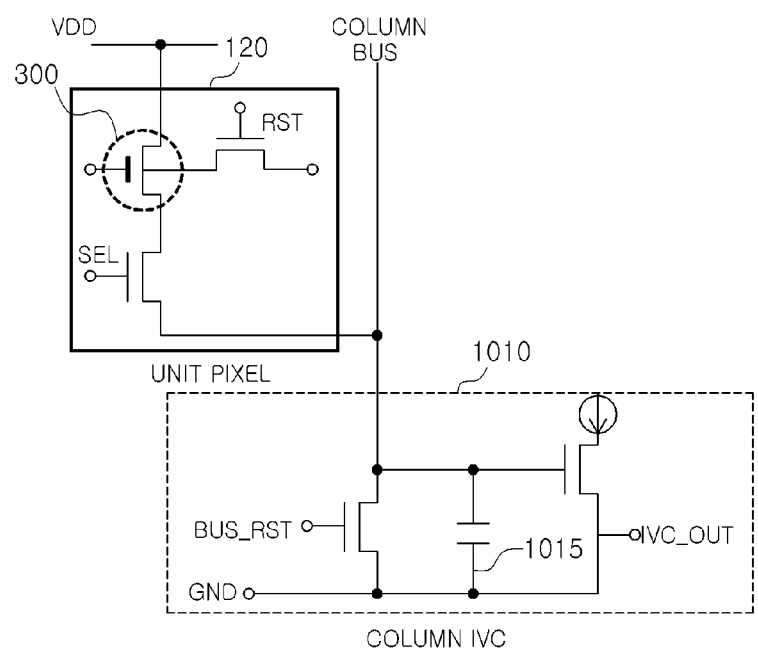
FIG. 10 is a schematic configuration of a second unit pixel of an image sensor according to the second embodiment of the present invention.
Figure 11:
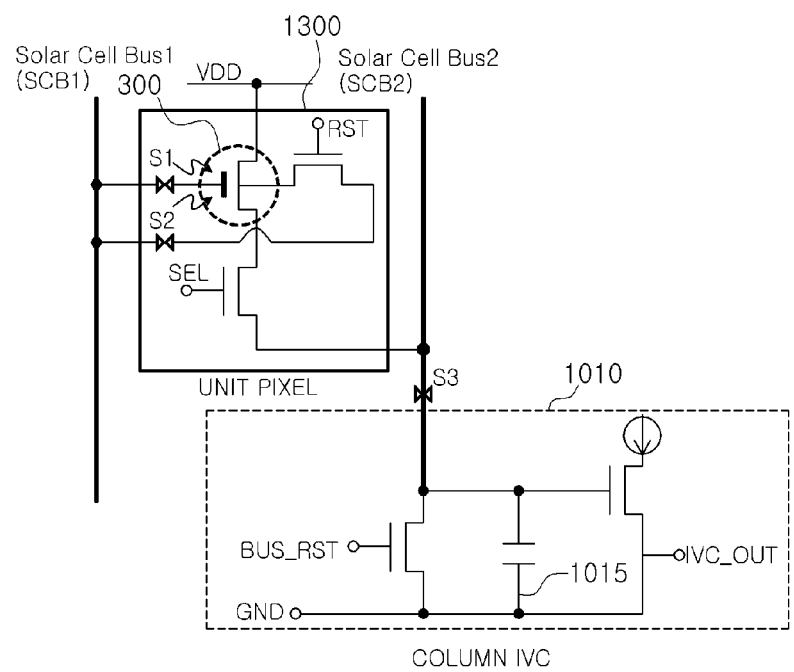
FIG. 11 is a schematic configuration of a second unit pixel of a solar cell according to the second embodiment of the present invention.

More specifically, the unit pixel 1100 comprises the photo detector 300 that generates photoccurent, driven by incident light onto the gate, along the channel between the source and the drain; a first switch, S1, that links the gate terminal of the photo detector 300 and the first solar cell bus, SCB 1, to be made or broken; and a selection device, SEL, that links the source terminal of the photo detector 300 and the second solar cell bus, SCB 2, to output the photocurrent off the pixel output terminal 1010, where the pixel output terminal 1010 corresponds to the IVC circuit 1010 shown in FIGS. 10 and 11 while the unit pixel 1100 may additionally include a second switch, S2, that links the selection device and the pixel output terminal 1010 to be made or broken. Electric power is generated from photocurrent and Voc obtained between the first solar cell bus, SCB 1, and the second solar cell bus, SCB 2, by connecting, via the first switch, S1, the first solar cell bus, SCB 1 and the gate of the photo detector 300 and utilizing, via the second switch, S2, the column bus, CB, shown in FIG. 8 as the second solar cell bus, SCB 2. In other words, either image sensor or solar cell may be selectively operated as aforementioned by making or breaking the first switch, S1, and the second switch, S2, where the unit pixel 1000 operates as a solar cell when the first switch, S1, is on while the selection device, SEL, or the second switch, S2, is off whereas the unit pixel 1000 operates as an image sensor when the first switch, S1, is off while the second switch, S2, is on.

In addition, the pixel output terminal 1010 includes a capacitor 1015 that links the second solar cell bus, SCB 2 and the ground section, GND, and stores the photocurrent and a reset device, BUS_RST, that is wired in parallel to the capacitor 1015 and links the second solar cell bus, SCB 2 and the ground section, GND.

FIG. 10 is a schematic configuration of a second unit pixel of an image sensor according to the second embodiment of the present invention. The second unit pixel 1200 additionally includes a reset device, RST, that is wired to the well of the photo detector 300 in addition to the existing the photo detector 300 and the selection device, SEL, shown in FIG.

8. The unit pixel 1200 may operate as an image sensor by wiring each of columns of the unit pixel to the IVC circuit 1010. When the selection device is switched on, the photocurrent photoelectrically converted in the photo detector 300 is stored in the capacitor 1015 of the IVC circuit 1010. The photocharges thus stored in the capacitor 1015 is to be output as voltage the amount of which is IVC-OUT and the signal of which is transmitted to circuits including CDS.

When the selection device, SEL, is switched on, should the BUS_RST be switched on, the column bus, SC, and the photo detector 300 as well as the capacitor 1015 in the IVC circuit 1010 are directly connected to the ground section, GND, which discharges the charges accumulated and resets the signals.

The reset device, RST, may be used when the signals are not reset seamlessly via the photo detector 300 or in order to manually adjust the threshold voltage of the current channel. The reset device, RST, may also be used to specially acquire images with a high frame rate without delay, etc.

FIG. 11 illustrates a schematic configuration of a second unit pixel of a solar cell according to the second embodiment of the present invention. The second unit pixel 1300 is a solar cell into which the unit pixel 1200 of the 2T-type image sensor shown in FIG. 10 has been materialized. The second unit pixel 1300 comprises a photo detector 300 that drives photocurrent, induced by incident light onto the gate, to flow along the channel between the source and that drain; a first switch, S1, that links the gate terminal of the photo detector 300 and a first solar cell bus, SCB 1 and is switched on or switched off; a second switch, S2, that links the reset terminal of the photo detector 300 and the first solar cell bus, SCB 1 and is switched on or switched off; a selection device, SEL, that links the source terminal of the photo detector 300 and the second solar cell bus, SCB 2 to putout the photoccurent off the pixel output terminal 1010; and, additionally, a reset device, RST, that is wired to the well of the photo detector 300, where the reset terminal, RST, is doped with impurities that are different from those doped in the source and the drain.

Moreover, the second unit pixel 1300 may additionally include a third switch, S3, that is switched on or switched off being wired between the selection device, SEL, and the pixel output terminal 1010. The unit pixel operates as a solar cell when the first switch, S1, or the second switch, S2, is on while the third switch is off whereas the unit pixel operates as an image sensor when the first switch, S1 and the second switch, S2, are off while the third switch, S3, is on. The first switch, S1, and the second switch, S2, may be simultaneously turned on in order to obtain a larger amount of Voc.

The pixel output terminal 1010 includes a capacitor 1015 that, being wired between the second solar cell bus, SCB 2, and the ground section, GND, stores the photocurrent; and a reset device, BUS_RST, that is wired between the second solar cell bus, SCB 2, and the ground section, GND, and wired in parallel to the capacitor 1015, on the basis of the configuration of which electric power is generated from photocurrent and Voc obtained between the first solar cell bus line, SCB 1, and the second solar cell bus line, SCB 2.

The description thus far is nothing more than an exemplification of the present invention and a person skilled in the art to which this invention belongs may, deviating from neither technical thoughts nor essential features of the present invention, amend and modify those exemplifications.

In this perspective, the embodiments demonstrated in the specification must be interpreted to exemplify, not to restrict, the technical thoughts of the present invention. Each element as a single, integrated component according to an embodiment of the present invention, for example, may be divided into a plurality of elements to be practiced whereas an element as a plurality of non-integrated components may be combined into a single, integrated component to be practiced.

The scope of the present invention should be interpreted on the basis of the claims undermentioned of the specification. The meaning and scope of the claims of the specification, and all the modification and transformation derived from the thoughts equivalent to the thoughts of the claims must be included to the scope of the present invention.

The invention claimed is:

1. A unit pixel element, which acts as an image sensor or a solar cell, comprising:
    a photo detector that drives a photocurrent flow, induced by light incident onto a gate, along a channel between a source and a drain;
    a first switch that is wired and switched on or switched off between a source terminal of the photo detector and a first solar cell bus;
    a second switch that is wired and switched on or switched off between a gate electrode of the photo detector and a second solar cell bus; and
    a third switch that is wired and switched on or switched off between a reset terminal of the photo detector and the second solar cell bus.

2. The unit pixel element of claim 1, wherein a reset terminal is doped with impurities that are different from those doped in the source and the drain.

3. A unit pixel element, which acts as an image sensor or a solar cell, comprising:
    a photo detector that drives a photocurrent flow, induced by light incident onto a gate, along a channel between a source and a drain;
    a first switch that is switched on or switched off between a gate terminal of the photo detector and a first solar cell bus;
    a selection device that is wired between a source terminal of the photo detector and a second solar cell bus in order to output the photocurrent off a pixel output terminal; and
    a second switch that is wired and switched on or switched off between the selection device and the pixel output terminal.

4. The unit pixel element of claim 3, wherein the unit pixel acts as a solar cell when the first switch is on whereas the selection device or the second switch is off.

5. The unit pixel element of claim 3, wherein the unit pixel acts as an image sensor when the first switch is off whereas the second switch is on.

6. The unit pixel element of claim 3, wherein the pixel output terminal includes a capacitor that links the second solar cell bus and a ground section, and stores the photocurrent.

7. The unit pixel element of claim 6, wherein the pixel output terminal additionally includes a reset device that links the second solar cell bus and the ground section and is wired in parallel to the capacitor.

* * * * *